United States Patent [19]

Ryan et al.

[11] Patent Number: 5,529,670

[45] Date of Patent: Jun. 25, 1996

[54] METHOD OF DEPOSITING CONDUCTORS IN HIGH ASPECT RATIO APERTURES UNDER HIGH TEMPERATURE CONDITIONS

[75] Inventors: James G. Ryan, Essex Junction; David C. Strippe, Waterbury Center, both of Vt.; Bernd M. Vollmer, Wappingers Falls, N.Y.

[73] Assignees: International Business Machines Corporation, Armonk, N.Y.; Siemens Aktlengesellschaft, Berlin, Germany

[21] Appl. No.: 172,017

[22] Filed: Dec. 22, 1993

Related U.S. Application Data

[63] Continuation of Ser. No. 914,660, Jul. 15, 1992, abandoned, which is a continuation of Ser. No. 688,020, Apr. 19, 1991, abandoned.

[51] Int. Cl.$^6$ .................................................. C23C 14/34
[52] U.S. Cl. ............................... 204/192.15; 204/192.17; 204/298.11
[58] Field of Search .................... 204/192.12, 192.17, 204/192.15, 192.3, 298.06, 298.11, 298.14

[56] References Cited

U.S. PATENT DOCUMENTS

| | | | |
|---|---|---|---|
| 4,724,060 | 2/1988 | Sakata et al. | 204/298.11 |
| 4,725,566 | 2/1988 | Ngu et al. | 437/180 |
| 4,756,810 | 7/1988 | Lamont, Jr. et al. | 204/298.09 X |
| 4,783,248 | 11/1988 | Kohlhase et al. | 204/192.17 |
| 4,822,753 | 4/1989 | Pintchovski et al. | 437/192 |
| 4,824,544 | 4/1989 | Mikalesen et al. | 204/298.11 X |
| 4,897,709 | 1/1990 | Yokoyama et al. | 357/68 |
| 4,920,073 | 4/1990 | Wei et al. | 437/200 |
| 4,994,162 | 2/1991 | Armstrong et al. | 204/192.12 X |
| 5,008,217 | 4/1991 | Case et al. | 437/195 |
| 5,026,470 | 6/1991 | Bonyhard et al. | 204/298.16 |
| 5,330,628 | 7/1994 | Demaray et al. | 204/298.11 X |

FOREIGN PATENT DOCUMENTS

| | | | |
|---|---|---|---|
| 044372 | 1/1982 | European Pat. Off. | G03F 1/00 |
| 62-017173 | 6/1987 | Japan | C23C 14/36 |
| 62-199033 | 2/1988 | Japan | H01L 21/88 |
| 310965 | 12/1988 | Japan | 204/298.11 |

OTHER PUBLICATIONS

"High Aspect Ratio Hole Filling by Tungsten Chemical Vapor Deposition Combined with a Silicon Sidewall and Barrier Metal for Multilevel Interconnection," K. Suguro et al., *J. Appl. Phys.* 62(4), 15 Aug. 1987, pp. 1265–1273.

"Thin Film Processes," J. L. Vossen et al., *Academic Press*, 1978, pp. 32–39.

"Collimated Magnetron Sputter Deposition," S. M. Rossnagel et al. J. Vac. Sci. Technology A, vol. 9, No. 2, Apr. 1991, pp. 261–265.

Abstract of presentation by Stephen M. Rossnagel on Oct. 27, 1989 at the American Vacuum Society Conference.

*Primary Examiner*—Nam Nguyen
*Attorney, Agent, or Firm*—Robert A. Walsh; Mark F. Chadurjian

[57] ABSTRACT

A sputtering deposition wherein high aspect ratio apertures are coated with conductive films exhibiting low bulk resistivity, low impurity concentrations, and regular morphologies. A collimator is used having an aspect ratio that approximates the aspect ratio of the apertures. The resulting film thickness at the bottom of the aperture is at least 2× what can be achieved using conventional sputtering methods. The amount of material deposited at the bottom of the apertures can be further enhanced by elevating the temperature of the substrate (e.g. 450° C.) during the deposition process.

10 Claims, 4 Drawing Sheets

| WAFER SAMPLE | GRAIN SIZE (NM) | FILM THICKNESS (NM) | BULK RESISTIVITY (uOHM-CM) |
|---|---|---|---|
| 200 mm, 150C., Ar/N2 CENTER | 6-15 | 61 | 866 |
| 200 mm, 150C., Ar/N2 EDGE | 4-10 | 62 | 306 |
| 200 mm, 150C., N2 ONLY CENTER | 7-17 | 66 | 1180 |
| 200 mm, 150C., N2 ONLY EDGE | 6-10 | 73 | 305 |
| 125 mm, 150C., N2 ONLY CENTER COLLIMATED | <10 | 59 | 124 |
| 125 mm, 150C., N2 ONLY EDGE COLLIMATED | <10 | 61 | 102 |
| 200 mm, 500C., Ar/N2 CENTER | 5-16 | 58 | 560 |
| 200 mm, 500C., N2 ONLY EDGE | 4-12 | 64 | 205 |
| 200 mm, 500C., N2 ONLY CENTER | 6-15 | 63 | 640 |
| 200 MM, 500C., N2 ONLY EDGE | 5-15 | 75 | 190 |
| 125 mm, 450C., N2 ONLY CENTER, COLLIMATED | <10 | 60 | 90 |

FIG. 2

METHOD OF DEPOSITING CONDUCTORS IN HIGH ASPECT RATIO APERTURES UNDER HIGH TEMPERATURE CONDITIONS

This is a continuation of application Ser. No. 07/914,660 filed on Jul. 15, 1992 abandoned which is a continuation of 07/688,020, abandoned, filed Apr. 19, 1991.

BACKGROUND OF THE INVENTION

1. Technical Field

The invention relates generally to the interconnection of integrated circuit structures, and more particularly to the formation of conductors within high aspect ratio apertures.

2. Background Art

As integrated circuit structures have become more compact, the need for low resistance metal connections between these structures has increased. Chemically vapor deposited (CVD) tungsten, evaporated aluminum doped with copper or silicon, and titanium or cobalt silicide have been used recently in the industry to provide these interconnections.

It has been found that, in order to preserve the low resistivity of these metals, it is necessary to include some sort of barrier layer between the metal and the conductive structure to be contacted. These barrier layers prevent spiking between the metal and underlaying structures, while also preventing diffusion of nonconductive species that may penetrate into underlaying structures during the deposition of the metal. For example, during the deposition of CVD tungsten, fluorine byproducts of the chemical reduction of tungsten hexafluoride may penetrate lower layers and degrade resistivity characteristics.

Moreover, when the underlaying structures include non-reactive insulators such as silicon oxide, barrier layers provide enhanced adhesion between the metal and the insulator. Finally, some barrier layers such as titanium help reduce interfacial resistance by reacting with, and removing, native oxides and etch residuals from exposed interfaces.

One of the layers that has been used recently in the art is titanium nitride (TIN). Typically, the TiN barrier layer is formed by reactive sputtering from a titanium source in a nitrogen-containing ambient or directly from a titanium nitride source. Examples include U.S. Pat. No. 4,783,248, "Method For The Production Of A Titanium/Titanium Nitride Double Layer," to Kohlhase et al. and assigned to Siemens; U.S. Pat. No. 4,822,753, "Method For Making A W/TiN Contact," to Pintchovski et al. and assigned to Motorola; and U.S. Pat. No. 4,920,073, "Selective Silicidation Process Using A Titanium Nitride Protective Layer," to Wei et al. and assigned to Texas Instruments.

Conventional sputtering provides satisfactory results when used on a planar surface. Moreover, it also is useful when used to coat the sidewalls and bottom of an aperture (or via) formed through a passivation or other insulating layer to an underlaying structure, where the ratio of the height of the aperture to its width (hereinafter the "aspect ratio" of the via) is less than 1:1. However, as the aspect ratio of the via increases, conventional sputtering does not provide acceptable results. Specifically, far less material is deposited at the bottom portions of the via or hole than at the top, since the walls "shadow" the lower exposed surface. As a result, deposited material at the upper surfaces increasingly accentuates the shadowing effect, thereby prematurely closing the upper section of the structure to be filled and preventing effective fill of the lower section.

This problem is illustrated in FIG. 5 of U.S. Pat. No. 4,879,709, "Titanium Nitride Film In Contact Hole With Large Aspect Ratio," to Yokoyama et al. and assigned to Hitachi. The sputtered titanium nitride is 135 nm thick on the upper surface of the passivation layer and only 40 nm thick at the bottom of the contact. Also, note that portions of the titanium nitride on the upper surface of the passivation layer extend into the contact hole to form rounded deposits on the upper sidewalls of the contact hole. This deposit will tend to close off the contact hole before it is completely filled by either sputtered or CVD deposited conductor films.

The solution disclosed by Yokoyama et al. is to deposit the titanium nitride in a plasma CVD reaction. By its very nature, CVD tends to be more conformal, such that the amount of material at the bottom of the contact hole will be similar to the amount on the upper horizontal surfaces. This will also prevent the formation of the aforementioned rounded deposits. Unfortunately, the deposition is carried out using chlorinated titanium species such as titanium tetrachloride. During the titanium reduction reaction, chlorinated reaction products may be incorporated into the titanium nitride, substantially reducing the low contact resistance benefits afforded by titanium nitride. Further, the omission of a pure Ti layer from the structure means that native oxides or other nonconductive residuals will not be removed from the bottom of the contact hole.

SUMMARY OF THE INVENTION

It is thus an object of the present invention to form a layer (s) of conductive material within high aspect ratio apertures.

It is another object of the invention to provide a barrier layer material(s) that provide high conductivity, low impurity concentrations, high gettering properties, and regular surface morphology, without introducing reactive products that may substantially degrade these properties.

It is yet another object of the invention to form such a barrier layer material by a process that enhances the amount of material at the bottom of a high aspect ratio aperture without introducing reactive byproducts that may substantially degrade contact resistance and other properties of the deposited material or of underlying layers or structures.

The above and other objects of the present invention are realized by depositing conductive materials by sputtering through a collimator under high temperature conditions. The collimator enhances the amount of material formed at the bottom of the aperture relative to the amount on the upper surface of the insulator. Moreover, the resulting material provides good resistivity and other properties without introducing reaction products that could degrade these properties. Depositing the films under high temperature conditions enhances film thickness at the bottom of the aperture. This effect increases increases with the aspect ratio of the collimator.

BRIEF DESCRIPTION OF THE DRAWING

The foregoing and other structures and teachings of the present invention will become more apparent upon review of the description of the best mode for carrying out the invention as rendered below. In the description to follow, reference will be made to the accompanying Drawing, in which:

FIG. 2 is a table of the bulk resistivities of layers of titanium nitride formed in accordance with the teachings of the invention;

DESCRIPTION OF THE BEST MODE FOR CARRYING OUT THE INVENTION

Figure 1:
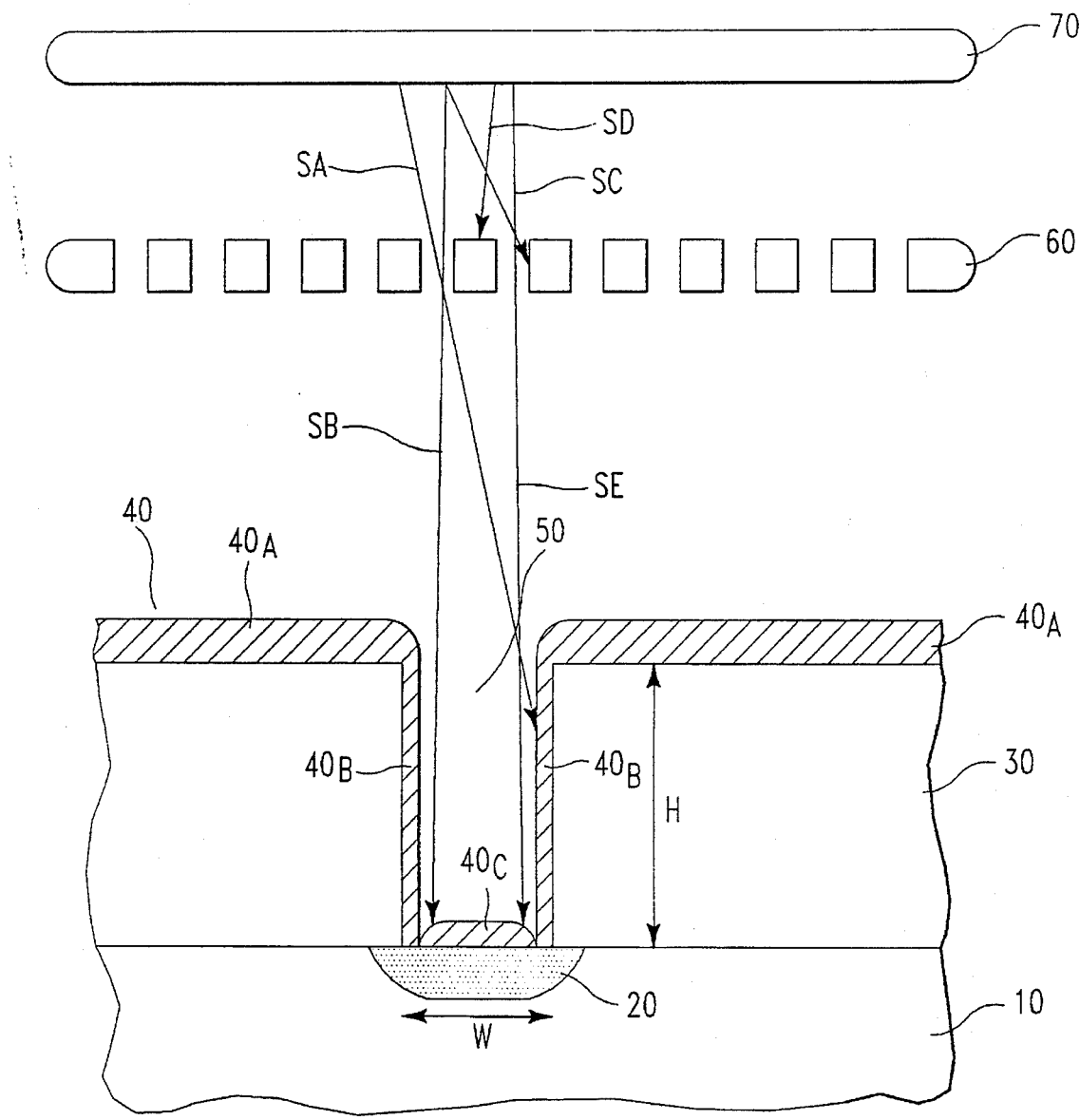
FIG. 1 is a cross-sectional view of an integrated circuit having the conductive material of the invention formed thereon, by deposition through a collimator.

With reference to FIG. 1, a substrate 10 is shown having an diffusion region 20 formed thereon, wherein the conductor of the invention 40 is deposited through an aperture 50 in passivation 30. Passivation Layer 30 of borophosphosilicate glass (BPSG) or phosphosilicate glass (PSG) is deposited at thickness H of approximately 11 k angstroms. A contact hole 50 is formed through the BPSG or PSG 30 to expose the diffusion region 20. The width W of the contact hole 50 is approximately 5000 angstroms, such that the aspect ratio H:W of the diffusion contact is on the order of 2:1.

In the invention, layer 40 is formed by reactive sputtering from a sputter target 70 through a collimator 60. The collimator 60 is disposed on a plane normal to the plane of the contact holes. Preferably, it is also parallel to the sputter target 70. The collimator 60 consists of a series of adjacent apertures formed in a 1 cm thick plate of steel or other material that will not melt or deform under the sputtering conditions discussed below. The apertures are arranged in a honeycomb pattern. An example of the use of a collimator to deposit sputtered material (copper) is given in a presentation Dy S. M. Rossnagel et al., "Lift-Off Magnetron Sputter Deposition," *American Vacuum Society 36th National Symposium, Boston Mass.*, Oct. 23–27 1989, Final Program p. 286 (copper deposited on lift-off structures to eliminate sidewall depositions); see also Rossnagel's U.S. Pat. No. 4,824,544.

The effect of the collimator is to restrict the paths of sputtered species to near-normal angles of incidence at the substrate surface. Species at other than near-normal angles deposit at the collimator surface, or within the collimator apertures. This is shown by lines SA-SE in the FIG. 1, which represent the sputter paths of atoms from target 50. Notice that sputter atoms with paths SA, SB, and SM pass through the collimator apertures and are deposited on the substrate. Atoms along paths SC and SD, which vary off a non-normal angle of incidence, are not passed through the collimator.

In general, the result of sputtering though the collimator is to form a layer 40 in which the thickness of the portions 40C at the bottom of the contact hole is a nigher percentage of the thickness of portions 40A on the upper surface of the passivation layer than would nave been obtained without a collimator. Also, as will be discussed in more detail below, the resulting films exhibit morphology, contact resistance, and other properties that are superior in some respects to properties achieved using conventional sputtering. Finally, note that the material 40B deposited on the sidewalls of the contact hole is of fairly uniform thickness; there is no buildup on upper portions of the contact hole sidewalls as there would be if deposited using conventional sputtering techniques.

The results of various experiments carried out using sputtered titanium, titanium nitride, and a sputtered Ti/TiN bilayer stack will now be discussed below.

1. Sputtered Titanium Nitride

In one group of experiments, a blanket layer of titanium nitride was deposited on silicon dioxide at 150° C. in an N2 ambient by sputtering, where the only variable was the use of a collimator. Profiles of oxygen concentration in the films in depth were measured using electron spectroscopy for chemical analysis (ESCA). The TiN sputtered through a collimator had a surface oxygen content of approximately 30%. This was due to initial adsorption of ambient oxygen upon removal of the sample from the deposition unit. This oxygen percentage dropped to under 1% within the first 1/10 of the TiN thickness, and remained there throughout the rest of the film. For TiN layers sputtered without a collimator, the oxygen content started out at the same 30%, but it declined to approximately 6–8% within the same 1/10 thickness that the Tin through the collimator dropped to under 1%. Moreover, the TiN without collimated sputtering had on the order of 3–6% oxygen content throughout. These results indicate that the film deposited using collimation is more dense and less porous to post deposition oxygen contamination than is the film deposited without collimation. Note that low oxygen content is important since it minimizes the formation of Ti Oxide, which degrades the electrical resistivity and adhesive properties of the film.

This improvement was confirmed in another series of experiments in which bulk resistivities of the collimated versus non-collimated deposits were measured. FIG. 2 presents a table showing the results for a layer of TiN of given thickness formed on a 125 or 200 mm diameter silicon wafer, at the stated deposition temperature and ambient (equal amounts argon and nitrogen indicated as "Ar/N2," and alternatively a pure nitrogen ambient indicated as "N2"). The words "center" and "edge" refer to the vicinity of the wafer (the center versus the edge) from which readings were taken. Whether the wafers are 125 vs 200 mm does not have a bearing on the results. The results indicate that all else being equal, collimation reduces bulk resistivity by at least 3 times (102 uohms-cm versus 305 for depositions at 150° C. in N2 with measurements taken at the wafer edge; 124 versus 1180 (almost 10× less) with measurements taken at the wafer center; and 90 versus 640 (6× Less) for approximately 500° C. in N2 only, with measurements from the wafer center). This large reduction in bulk resistivity was greater than could be reasonably accounted for by less oxygen content and is attributed to a more dense microstructure of the film (i.e., fewer non-conducting voids).

In another group of experiments, TiN was deposited by sputtering techniques, again with collimation being the only variable, and the films were cleaved and analyzed from SEM micrographs. It was found that in general, the collimated TiN exhibits a very dense morphology, in the sense of less intergranular voiding than is present in sputtered TiN without collimation. Moreover, the film had a highly columnar grain structure. This more dense morphology may play an important role in the reduced bulk resistance noted above; moreover, the reduced intergranular voids may reduce oxygen penetration in the film and provide a more impervious barrier to penetration by reactive by-products of the CVD process.

2. Sputtered Titanium

Similar results were achieved for titanium deposited using the collimator. That is, collimated titanium tended to exhibit lower oxygen impurity concentrations, lower bulk resistivity, and more regular morphology.

Figure 3:
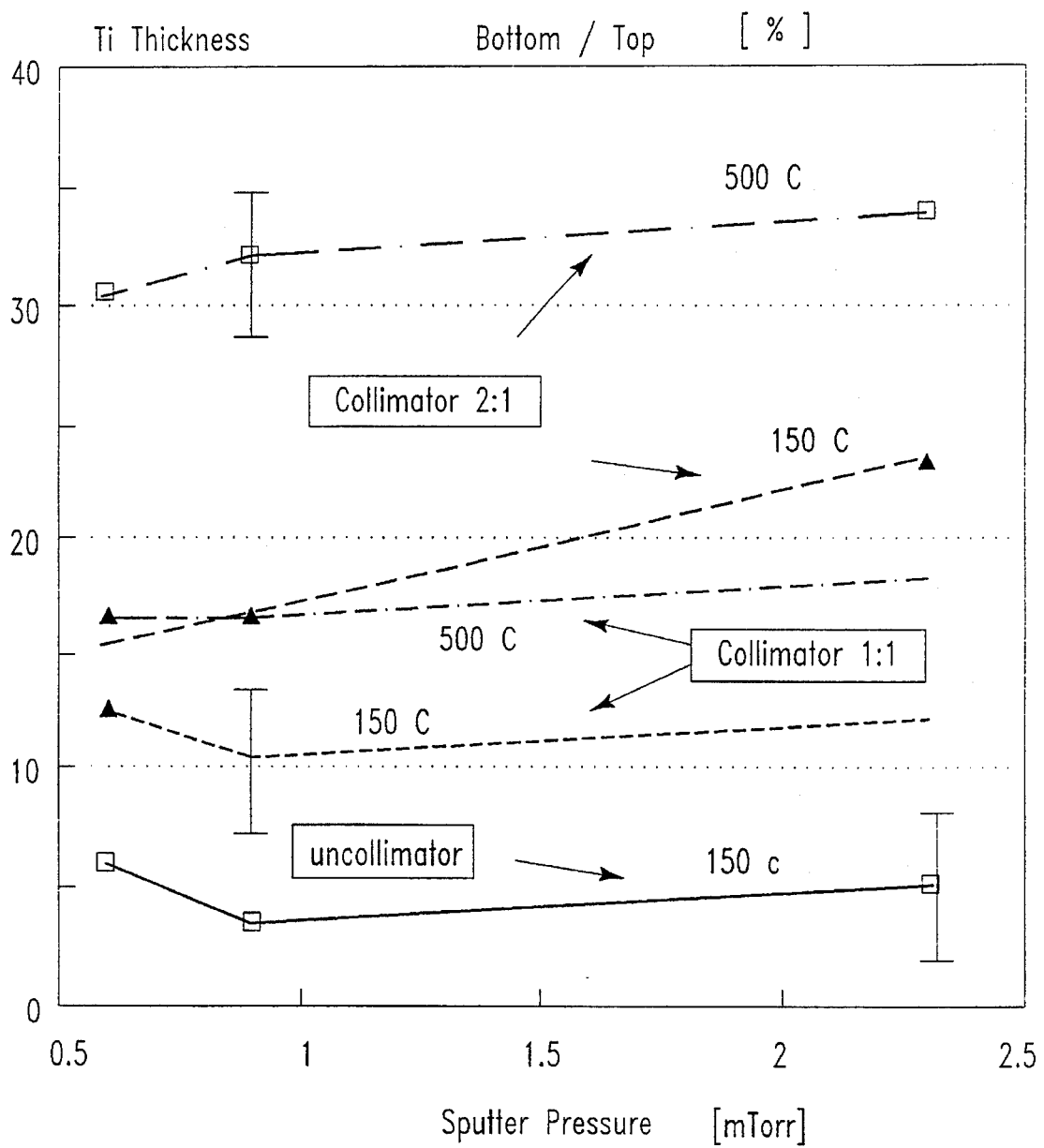
FIG. 3 is a graph of titanium thickness at the bottom of a high aspect ratio via versus sputter pressure in accordance with the teachings of the invention.

Additional studies illustrate the increase in the amount of material at the bottom of the contact hole. FIG. 3 is a plot of the thickness of titanium at the bottom of a contact hole having an aspect ratio of approximately 2:1, as a percentage of the thickness of titanium at the upper surface of the passivation layer, against sputter pressure. Note that the thickness of the uncollimated film at the bottom of the contact hole is only approximately 5% of the thickness of the layer at the upper surface of the passivation layer, over the entire range of sputter pressures studied.

Note that the thickness ratio increases as a collimator is used; as the deposition temperature is raised; and as the aspect ratio of the collimator is increased. The temperature at which titanium deposition is carried out plays a great role in film thickness at the bottom. At a collimator aspect ratio of 1, raising the deposition temperature above 150° C. to 500° C. increases the fractional deposit by 7%. At a collimator aspect ratio of 2:1, increasing the temperature from 150° to 500° C. doubles the film thickness at low pressures, and increases the percentage by 10% at higher sputter pressures. This phenomenon was not observed for titanium sputtered without a collimator; increasing the temperature did not increase the film thickness at the bottom of the contact hole by more than a few percent. Also, this phenomenon was not observed for uncollimated titanium nitride; again, carrying out TiN deposition at higher temperatures did not increase film thickness at the bottom of the contact hole by more than a few percent.

There is a direct relationship between increasing the aspect ratio of the collimator and increasing the fraction of deposited material at the bottom of the contact holes with respect to the top. Omitting the variations due to temperature (that is, considering only the 150° C. depositions shown in FIG. 3), and considering the data at a sputter pressure of 0.9 mTorr, note that the percentage is around 4% for the uncollimated case, 11% for the collimator at a 1:1 aspect ratio, and 17% for the collimator at a 2:1 aspect ratio, which is four times greater than the non-collimated case. Similar results are expected for titanium nitride since the sputtered titanium behaves similarly in N2 or N2/AR ambient.

Figure 4:
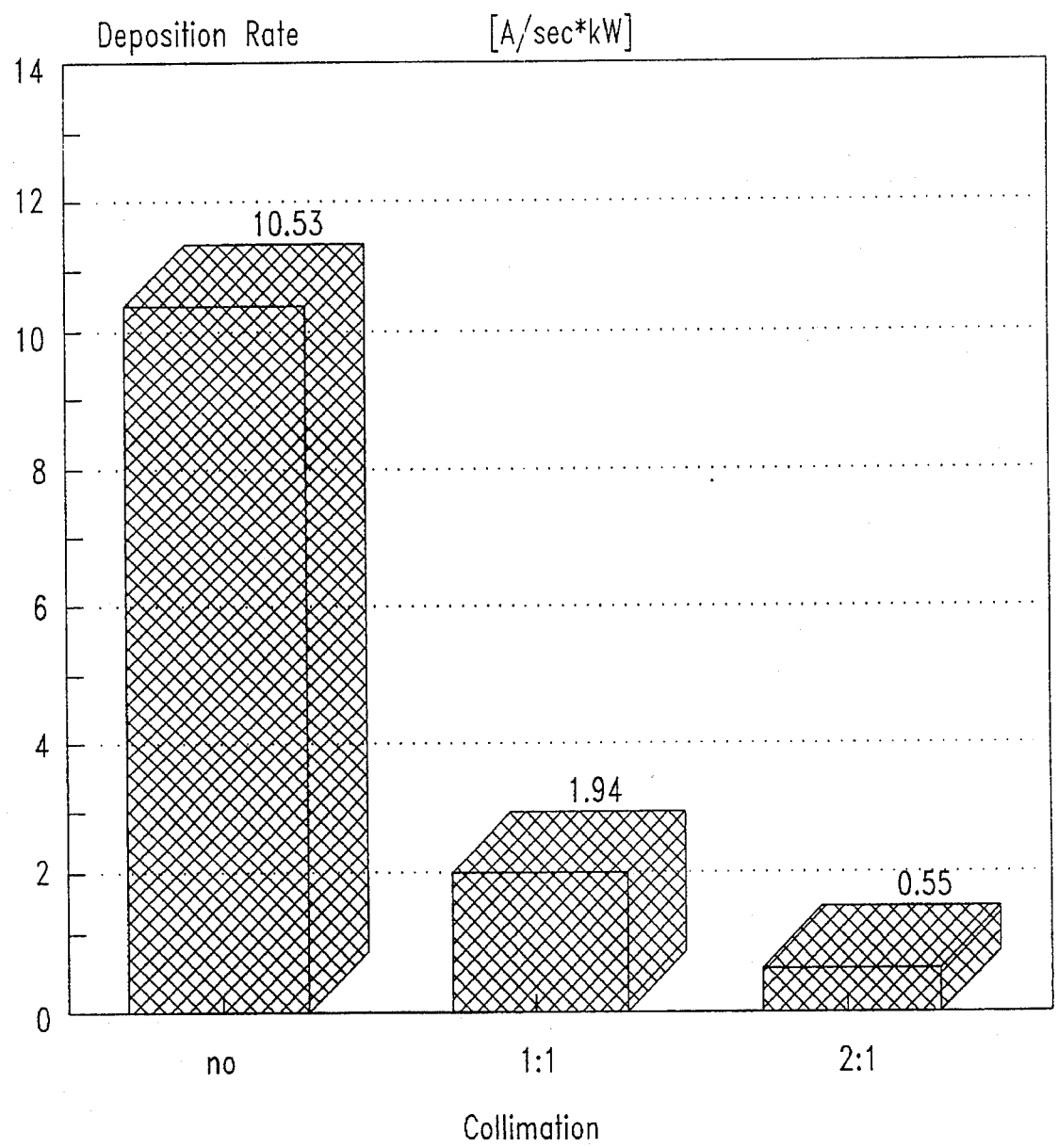
FIG. 4 is a bar chart of titanium deposition rate as a function of collimation aspect ratio.

The inventors have found that this increase in aspect ratio decreases the amount of material deposited in unit time by roughly the same 4× factor. As shown in FIG. 4, the deposition rate decreases markedly when a 1:1 collimator is used, and decreases by a factor of four from a 1:1 collimator to a 2:1 collimator. With reference to FIG. 1, as the aspect ratio of the collimator increases, the percentage of sputter atoms that follow a path SC will increase, such that less atoms are available for deposit. At the same time, the atoms that do make it through the collimator will be on a lower angle of incidence relative to the plane of the contact hole. In other words, the percentage of atoms following paths such as SB, SE will increase, thus increasing the percentage of atoms that make it to the bottom of the contact hole.

The inventors also found that the increased fractional deposit and not follow for contact holes having lower aspect ratios. A 2:1 collimator did not provide enhanced results over the results achieved using a 1:1 collimator for low aspect ratio features. Thus, the inventors postulate that the optimal trade-off between deposition rates and increased deposit at the bottom of the contact hole is provided where the aspect ratio of the collimator apertures is no greater than the aspect ratio of the contact holes.

Increased Ti at the bottom of high aspect ratio apertures has also been found to reduce the resistance of TiSi2 silicided electrodes. A collimated deposit (aspect ratio of 1.5:1) of titanium in a 0.8 um deep aperture greatly reduced ultimate silicide resistance is compared to the non-collimated case. The resistance decrease/stabilization increased with the aspect ratio of the aperture.

3. Sputtered Ti/TiN Bilayer

The results discussed above for Ti and TiN singularly appear to provide a synergistic effect in combination. Experiments were carried out in which 600 angstroms of Ti and 400 angstroms of TiN were successively sputtered through contact holes having 2:1 aspect ratios and greater, to contact separate n and p diffusion regions. The contact hole was then filled with blanket CVD tungsten, tungsten studs were formed by standard planarization processes and the filled contacts were interconnected by an aluminum wiring level. For non-collimated Ti/TiN, the mean contact resistance was 71 ohms/contact for the N+ contact, and 138 ohms/contact for the P+ contact. For collimated Ti/TiN, the contact resistance was approximately 1 ohm/contact for both N+ and P+ contacts. Again, sputtering through a collimator greatly reduces contact resistance when compared to non-collimated depositions. We attribute this reduction in contact resistance to a reaction of the additional titanium deposited at the bottom of the contact. In addition, the more dense nature of the collimated TiN barrier film prevents fluorine penetration under and into titanium during the CVD tungsten deposition process.

Having discussed the various experimental results achieved using collimated sputtering, we will now discuss the specifics of the sputtering process itself. The general process is similar to conventional sputtering methods. A gaseous plasma of an inert atom such as Argon is created that bombards the cathode target, dislodging atoms that are deposited on the electrically decoupled substrate. In the case of titanium nitride, better process control is achieved by eliminating argon from the system, and using N2 gas as both the bombardment source and the recombinant specie that reacts with the titanium atoms to form a titanium nitride deposit.

Plasma (working) gas atoms (e.g. Ar) scatter sputtered atoms, potentially knocking them "off-line" after the sputtered atoms pass through the collimator. Therefore, it is important that low working gas pressures (less than 1.0 mTorr) are used when depositing through a collimator in order to lessen scattering. Working gas composition also affects scattering. Argon atoms tend to cause greater deflection of sputtered atoms than would a lighter working gas such as nitrogen. Pure nitrogen is the preferred working gas to deposit TiN using a collimator. The use of pure nitrogen assures that, even at the low pressures required with collimation, sufficient nitrogen is present to form TiN. The tradeoff here is that the lighter N2 atoms are not as efficient in dislodging titanium atoms from the sputter source, such that the cathode power has to be increased from 3–6 kW for the usual argon ambient to 6–9 kW of the N2 ambient.

These experiences with TiN deposition lead to several conclusions as to how to minimize gas scattering. One conclusion is to use lighter inert atoms even when sputtering titanium. Another conclusion is to use lower sputter pressures (less than the conventional 3–4 mTorr; in the general range of less than −1.0 mTorr), even if argon is used as the inert sputtering specie.

EXAMPLE

Having generally discussed various aspects of the invention, a specific Example will now be discussed with reference to filling the contact hole shown in FIG. 1. The diffusion region 20 and passivation layer 30 are defined and deposited using conventional techniques. Then a photoresist mask is defined on the passivation layer 30 to define the contact hole 50, and the contact hole is etched using reactive ion techniques in a ambient CF4+O2. Note that the photoresist mask is fairly thick, such that the image will still be in place at the end of the etch process.

Then 600 angstroms of titanium and 400 angstroms of TiN are sputter deposited through a 1:1 collimator, at 0.7–1.0 mTorr pressure. During the titanium deposition the substrate temperature is maintained at 450° C., and argon is used as the inert bombardment atom. During the TiN deposition, the ambient is changed to N2. The resulting composite film has portion 40C that is on the order of 260 angstroms (or roughly 25%) of the thickness of portions 40A. Moreover, the sidewall portions 40B of the composite film have substantially uniform thickness along the entire contact hole sidewall, enhancing adhesion of subsequently-applied films. As previously discussed, the resulting film presents low bulk resistivity, low contact resistance, low oxygen concentration, and enhanced surface morphology as compared to similar films deposited without collimation. Also, the collimated TiN provides an improved barrier to fluorine penetration of the underlying films at the bottom of the contact hole. Fluorine contamination of underlying titanium films and silicides is known to cause failure by a number of mechanisms including loss of adhesion of CVD tungsten and high contact resistance. For some applications, the fluorine barrier properties of the layers can be further enhanced by carrying out an anneal step at 500°–600° C. in a N2 ambient to complete the conversion of any remaining Ti sidewall components to Ti nitride.

It is to be understood that various modifications can be made to the structures and teachings discussed above without departing from the spirit and scope of the invention. For example, while the invention has been discussed with reference to titanium and titanium nitride, it can be utilized in conjunction with any other sputtered, reactively sputtered or evaporated barrier material such as chromium, tungsten and TiW, as well as with materials such as tungsten and aluminum that would be used to fill such high aspect ratio apertures. Moreover, while the invention has been illustrated with reference to a particular contact embodiment, it can be applied to a broad range of applications in which high aspect ratio apertures are to be coated or filled. Finally, the specific times, temperatures pressures, ambients, etc. discussed can be optimized for a given application.

What is claimed:

1. In a process for depositing a titanium or titanium alloy from a deposition source onto an integrated circuit substrate, the substrate having a surface topography that includes at least one depression having an aspect ratio of approximately 1:1 or greater, the improvement comprising interposing a collimator and heating the substrate to at least approximately 450° to 500° C. during the deposition to enhance the thickness of said titanium or titanium alloy film as deposited at the bottom of said depression.

2. The process as recited in claim 1, wherein said alloy of titanium comprises titanium nitride.

3. The process as recited in claim 1, wherein the temperature of the substrate during the deposition is approximately 500° C.

4. The process as recited in claim 1, wherein apertures in said collimator have an aspect ratio of 2:1.

5. A process for depositing a layer of titanium or titanium alloy on a substrate having a surface topography that includes at least one horizontal surface and at least one depression having an aspect ratio of approximately 1:1 or greater, comprising:

causing atoms of said titanium or titanium alloy to pass through a collimator having apertures there-through with an aspect ratio of approximately 1:1 or greater before being deposited on the substrate, the substrate being at a temperature of at least 450° to 500° C. during said deposition, whereby the thickness of the deposited layer at the bottom of the depression is enhanced relative to the thickness of the deposited layer at the horizontal surface of the substrate.

6. The process as recited in claim 5, wherein said alloy of titanium comprises titanium nitride.

7. The process as recited in claim 5, wherein the temperature of the substrate is at least 500° C. during the deposition.

8. A process for sputtering a titanium or titanium alloy barrier layer onto a substrate having high aspect ratio apertures formed therein, comprising:

passing atoms of said titanium or titanium alloy from a sputtering source through a collimator having apertures therethrough with aspect ratios of approximately 1:1 or greater prior to deposition on the substrate, the substrate being at a temperature of approximately 450° to 500° C., to enhance the relative thickness of the titanium or titanium alloy deposited at the bottom of said apertures while maintaining substantially uniform sidewall thickness.

9. The process recited in claim 8, wherein the substrate temperature is approximately 500° C. during said deposition.

10. In a process of sputtering titanium into a contact hole in a passivation layer disposed on a substrate, the contact hole having an aspect ratio of at least 1:1, the improvement comprising heating the substrate to approximately 450°–500° C. while depositing said titanium through a collimator having an aspect ratio of at least 1:1 disposed between a titanium sputter source and the substrate.

* * * * *